US008569740B2

United States Patent
Kochergin

(10) Patent No.: US 8,569,740 B2
(45) Date of Patent: Oct. 29, 2013

(54) HIGH EFFICIENCY THERMOELECTRIC MATERIALS AND DEVICES

(75) Inventor: Vladimir Kochergin, Christiansburg, VA (US)

(73) Assignee: MicroXact Inc., Christiansburg, VA (US)

( * ) Notice: Subject to any disclaimer, the term of this patent is extended or adjusted under 35 U.S.C. 154(b) by 212 days.

(21) Appl. No.: 12/686,349

(22) Filed: Jan. 12, 2010

(65) Prior Publication Data

US 2011/0168978 A1 Jul. 14, 2011

(51) Int. Cl.
*H01L 29/66* (2006.01)
*H01L 21/20* (2006.01)
(52) U.S. Cl.
USPC .......... 257/15; 257/10; 257/168; 257/71; 257/E21.09; 257/E29.168; 136/205; 136/201; 136/200; 136/212

(58) Field of Classification Search
USPC ........... 257/10–15, E21.09, E31.01, 168, 71, 257/616, E29; 136/205, 201, 200, 212
See application file for complete search history.

(56) References Cited

U.S. PATENT DOCUMENTS

| 2006/0032526 A1* | 2/2006 | Fukutani et al. | 136/205 |
| 2009/0084421 A1* | 4/2009 | Olsen et al. | 136/201 |
| 2010/0236596 A1* | 9/2010 | Lee et al. | 136/230 |

* cited by examiner

*Primary Examiner* — Cathy N Lam

(57) ABSTRACT

Growth of thermoelectric materials in the form of quantum well superlattices on three-dimensionally structured substrates provide the means to achieve high conversion efficiency of the thermoelectric module combined with inexpensiveness of fabrication and compatibility with large scale production. Thermoelectric devices utilizing thermoelectric materials in the form of quantum well semiconductor superlattices grown on three-dimensionally structured substrates provide improved thermoelectric characteristics that can be used for power generation, cooling and other applications.

10 Claims, 4 Drawing Sheets

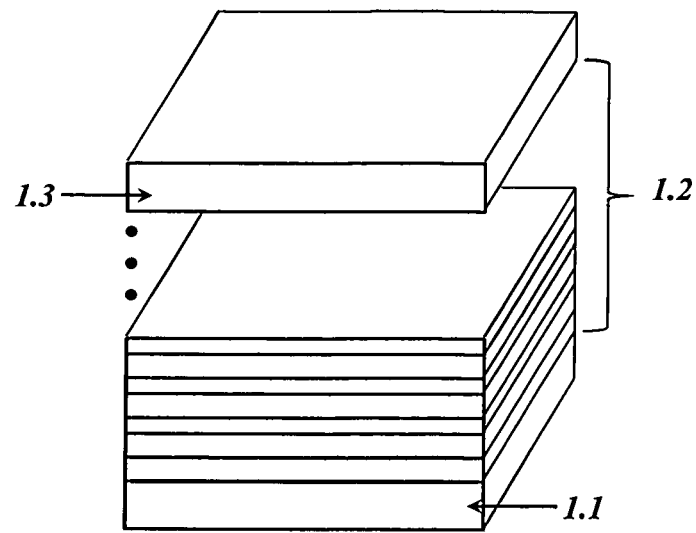
Figure 1. *PRIOR ART*
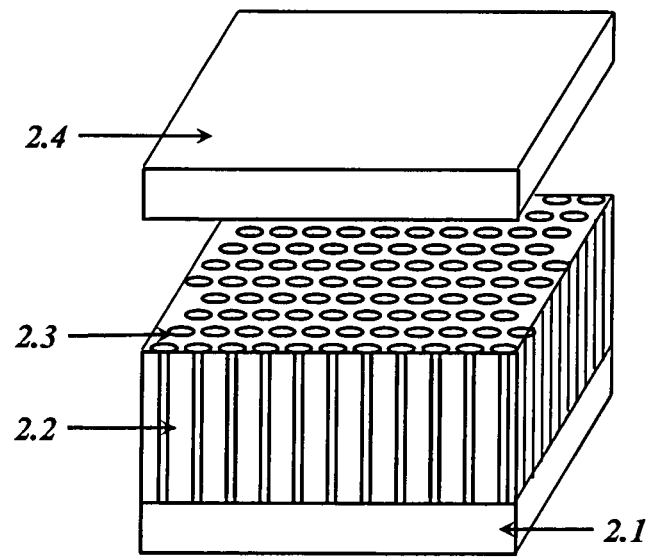
Figure 2. *PRIOR ART*

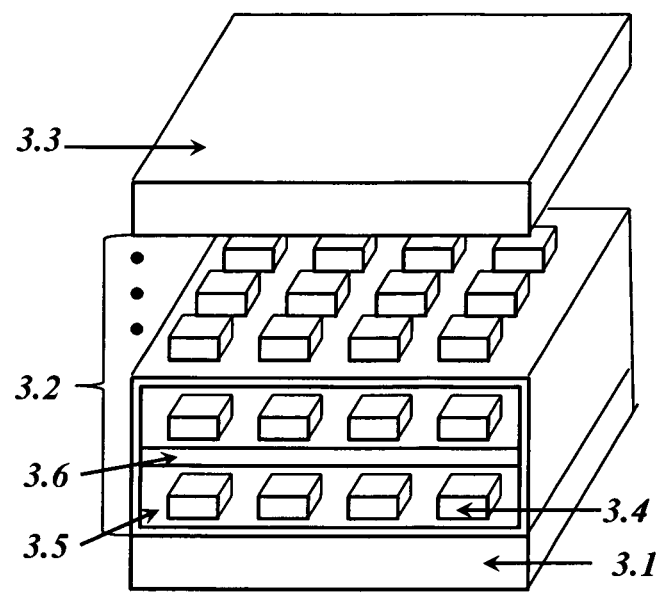
Figure 3. *PRIOR ART*
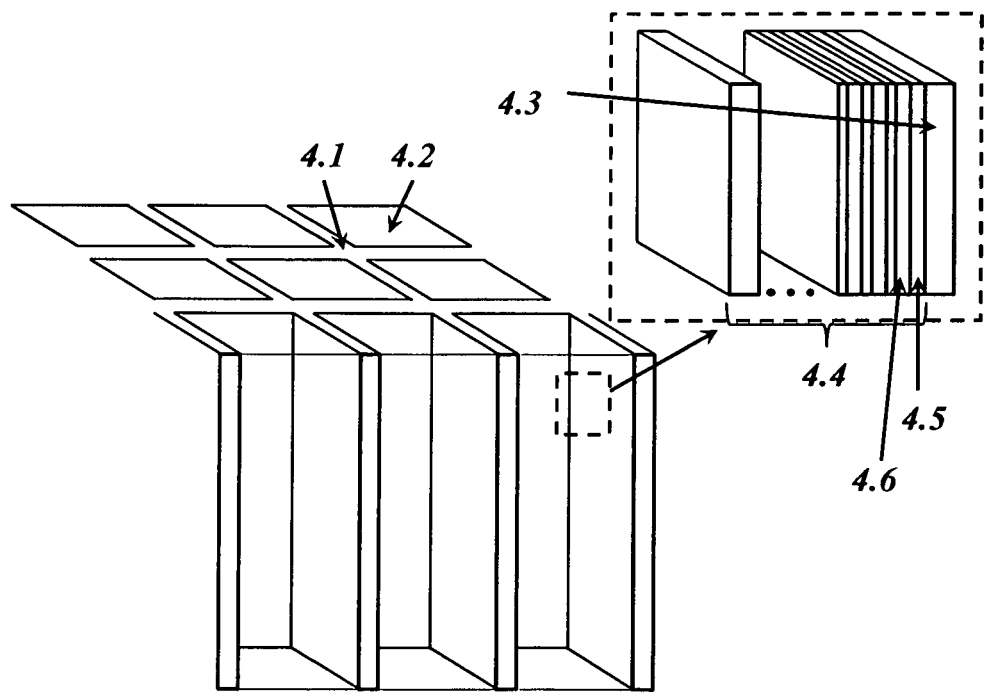
Figure 4.

HIGH EFFICIENCY THERMOELECTRIC MATERIALS AND DEVICES

STATEMENT REGARDING FEDERALLY SPONSORED RESEARCH OR DEVELOPMENT

The invention titled "High Efficiency Thermoelectric Materials and Devices" was made with Government (NASA) support and the Government (NASA) has certain rights in this invention.

CROSS-REFERENCES TO RELATED APPLICATIONS

Not applicable.

FIELD OF THE INVENTION

The present invention relates to thermoelectric materials and devices, method of fabrication of thermoelectric materials and devices and applications of the same as coolers, heaters and power converters. In more detail, the present invention is related to three-dimensionally structured thermoelectric materials utilizing enhanced thermoelectric properties in quantum-size structures, such as quantum wells, quantum wires or quantum dots, and method of fabrication of said material by depositing the enhanced-performance thermoelectric layers on three-dimensionally structured templates. The thermoelectric materials of the present invention will improve the cooling/heating or conversion efficiency of thermoelectric materials and will improve the performance of thermoelectric devices.

BACKGROUND OF THE INVENTION

Thermoelectric (TE) devices are used in a wide range of commercial, military and aerospace applications. For a non-limiting example, applications of TE materials in NASA missions are important due to high premium of power generation in such missions to convert waste heat from turbine engines, hot sides of aircraft etc. into electric energy. Radioisotope thermoelectric generators (RTGs) were used by NASA in 25 U.S. missions (including Apollo missions to the Moon, the Viking missions to Mars, and the Pioneer, Voyager, Ulysses, Galileo, and Cassini missions to the outer solar system) since 196. However, at present commercially available TE devices typically offer limited heat to electricity conversion efficiencies, well below the fundamental thermodynamic (Carnot) limit due to limited Figure of Merit, ZT of thermoelectric materials:

$$ZT = S^2 \sigma T / \kappa,$$

where $S$, $\sigma$, $T$, and $\kappa = \kappa_e + \kappa_p$ are, respectively, the Seebeck coefficient, electrical conductivity, temperature, and thermal conductivity consisting from electron and phonon parts [H. J. Goldsmid, *Thermoelectric Refrigeration*, Plenum Press, New York 1964].

The ZT of the material is related to the efficiency of the TE device as:

$$\eta = \gamma \frac{(1 + ZT)^{1/2} - 1}{(1 + ZT)^{1/2} + T_{hot}/T_{cold}}$$

where $T_{hot}$ and $T_{cold}$ are temperatures (in K) of hot and cold side of the TE material.

From the 1960s to the 1990s, only incremental gains were achieved in increasing ZT, with the $(Bi_{1-x}Sb_x)_2(Se_{1-y}Te_y)_3$ alloy family remaining the best commercial material with ZT~1. The breakthrough in material science in high ZT TE materials occurred in 1990s when low-dimensional materials systems [L. D. Hicks, et al., Phys. Rev. B: Condens. Matter Mater. Phys. 1996, 53, R10493], [J. Heremans, in *Thermoelectric Materials 2003—Research and Applications*, MRS Symp. Proc. (Eds: G. S. Nolas, J. Yang, T. P. Hogan, D. C. Johnson), Materials Research Society Press, Pittsburgh, Pa. 2004, pp. 3-14], [T. Koga, et al., in *Thermoelectric Materials—The Next Generation Materials for Small-Scale Refrigeration and Power Generation Applications*, MRS Symp., MRS Press, Pittsburgh, Pa., 2000, pp. Z4.3.1-4.3.6] were shown to exhibit significantly higher ZT value than that in bulk materials. In conventional 3D crystalline systems the quantities S, $\sigma$, and $\kappa$ are interrelated such as independent control of these variables to increase ZT is very difficult: an increase in S typically results in a decrease in $\sigma$, and a decrease in a produces a decrease in the electronic contribution to $\kappa$, following the Wiedemann-Franz law [A. Bejan, A. D: Allan, Heat Transfer Handbook Wiley, New York, 2003, p. 1338]. This is not the case for materials with reduced dimensionality, such as quantum wells, QW (2D), quantum wires (1D) and quantum dots, QD (0D) where introduction of a new variable (length scale) permits to decouple the aforementioned parameters and to optimize them simultaneously. For example, this is accomplished by the introduction of many interfaces, which scatter phonons more effectively than electrons, or by filtering out the low-energy electrons at the interfacial energy barriers, thus allowing the development of nanostructured materials with enhanced ZT, suitable for thermoelectric applications. However, despite of theoretical predictions and experimental demonstrations such materials are yet to found practical applications. The deficiencies of the approaches know to those skilled in the art can be understood from the following considerations:

U.S. Pat. Nos. 5,436,467 and 5,550,387 titled "Superlattice quantum well thermoelectric material" and "Superlattice quantum well material" issued to Elsner, et al. on Jul. 25, 1995 and on Aug. 27, 1996 respectively teach a multi-layer superlattice quantum well thermoelectric material using materials for the layers having the same crystalline structure (illustrated in FIG. 1). A preferred embodiment is a superlattice of Si and SiGe, both of which have a cubic structure. Another preferred embodiment is a superlattice of Boron-Carbon (B—C) alloys, the layers of which would be different stoichiometric forms of B—C but in all cases the crystalline structure would be alpha rhombohedral. Molecular Beam Epitaxy (MBE) on essentially planar substrates is disclosed as a technique for fabricating of such thermoelectric materials and devices. While thin (up to few micrometers) films of such materials can be indeed fabricated to have significantly enhanced ZT values, fabrication of much thicker layers needed for practical applications with such a technique is neither cost effective nor even feasible (material thicknesses anywhere from 10s of um to mm are required, depending on particular parameters of the TE device and its use, such as heat sink parameters, boundary resistances, etc).

U.S. Pat. No. 5,866,292 titled "Thermoelectric material" issued to Nishimoto on Mar. 23, 1999 is effectively expanding the range of semiconductor materials comprising quantum well superlattice (to $FeS_2$ semiconductor, PbTe semiconductor and BiTe semiconductor) while offering (magnetron) sputtering on essentially planar as a preferred deposition method and providing more narrow range of quantum well thicknesses to achieve enhanced ZT. While sputtering is known as more economic process than MBE, deposition of practical thicknesses multilayer structures of acceptable quality (low defect density, etc.) is barely feasible and clearly impractical.

U.S. Pat. No. 5,886,390 titled "Thermoelectric material with diffusion-preventive layer" issued to Nishimoto on Mar. 23, 1999 teaches a quantum well multilayer with a diffusion-preventive layer being interposed between neighboring conductive layers and barrier layers. Diffusion between the conductive layers and the barrier layers under high-temperature conditions is prevented, and the thermoelectric material maintains high performance standards at high temperatures. This patent also suggests sputtering on essentially planar substrates as a deposition technique, hence, all the deficiencies of previously reviewed U.S. Pat. No. 5,866,292 are still valid.

U.S. Pat. No. 6,060,656 titled "Si/SiGe superlattice structures for use in thermoelectric devices" issued to Dresselhaus, et al. on May 9, 2000 teaches A superlattice structure for use in thermoelectric power generation systems includes m layers of a first one of Silicon and Antimony doped Silicon-Germanium alternating with n layers of Silicon-Germanium which provides a superlattice structure having a thermoelectric figure of merit which increases with increasing temperature above the maximum thermoelectric figure of merit achievable for bulk SiGe alloys. It suggests MBE deposition on essentially planar surfaces, so all arguments provided previously in relation to deficiencies of U.S. Pat. Nos. 5,436,467 and 5,550,387 are still valid.

U.S. Pat. Nos. 6,096,964 and 6,096,965 titled "Quantum well thermoelectric material on thin flexible substrate" and "Quantum well thermoelectric material on organic substrate" respectively, both issued to Ghamaty, et al. on Aug. 1, 2000 teach the thermoelectric elements having a very large number of alternating layers of semiconductor material (such as Si/SiGe) deposited on a very thin flexible substrate. These patents teach use of magnetron sputtering of quantum well superlattice on essentially planar structures, so all the provided previously arguments related to deficiencies of U.S. Pat. No. 5,866,292 are still valid.

U.S. Pat. No. 6,452,206 titled "Superlattice structures for use in thermoelectric devices" issued to Harman, et al. on Sep. 19, 2002 teaches a superlattice structure includes m monolayers of a first barrier material alternating with n monolayers of a second quantum well material with a pair of monolayers defining a superlattice period and each of the materials having a relatively smooth interface therebetween. The patent teaches the use of a material comprising a plurality of epitaxially grown (by MBE) alternating layers of materials A and B, where materials A and B are substantially lattice matched in a direction perpendicular to the direction of growth and are formed from materials which provide a thermoelectric figure of merit greater than 1.7 and which increases with increasing temperature. Since the patent suggests MBE deposition on essentially planar surfaces, so all arguments provided previously in relation to deficiencies of U.S. Pat. Nos. 5,436,467 and 5,550,387 are still valid.

U.S. Pat. Nos. 6,444,896 and 6,605,772 titled "Quantum dot thermoelectric materials and devices" and "Nanostructured thermoelectric materials and devices" respectively issued to Harman, et al. on Sep. 3, 2002 and Aug. 12, 2003 respectively teach the thermoelectric materials and devices utilizing quantum-dot superlattice (QDSL) structures to enhance ZT of the material (shown in FIG. 3). In both cases QDSL is provided on essentially planar substrate and epitaxial growth (such as with MBE) is suggested is a means for deposition of the material. Hence, all the arguments provided previously in relation to deficiencies of U.S. Pat. Nos. 5,436,467 and 5,550,387 are still valid.

U.S. Pat. No. 6,969,679 titled "Fabrication of nanoscale thermoelectric devices" issued to Okamura, et al. on Nov. 29, 2005 teaches thermoelectric material and device utilizing nanowires forming by plating into porous aluminum template. While with this technique the thickness of the thermoelectric material is limited only by the thickness of the porous alumina membrane (which can be in 10s or 100s of um as known to those skilled in the art), the main deficiency of such an approach is the insufficient density of nanowires to provide practical TE materials and devices with high cooling/heating or conversion efficiency. It is well known that porous alumina membranes of sufficient thickness (with 10s or 100s um) has pores with diameters typically exceeding 50 nm. On the other hand, it is well known for those skilled in the art that TE nanowires with <50 nm in diameter are preferable for high efficiency TE materials. While the diameter of the pores in porous alumina can be reduced by, for example, conformal coating of the pore walls, this would significantly reduce the nanowire filling fraction, indicating that the heat propagation through porous alumina host would dominate. Providing the electrical circuitry as taught by this patent to contact individual nanowires is impractical from fabrication standpoint.

U.S. Pat. No. 7,342,169 titled "Phonon-blocking, electron-transmitting low-dimensional structures" issued to Venkatasubramanian, et al. on U.S. Pat. No. 7,342,169 is teaching a thermoelectric structure comprising: a superlattice film of at least first and second material systems having different lattice constants and interposed in contact with each other; a physical interface at which said at least first and second material systems are joined with a lattice mismatch and at which structural integrity of said first and second material systems is maintained; said superlattice film of at least first and second material systems having a charge carrier transport direction normal to said physical interface and the superlattice film having a thickness of at least approximately 1.35 um wherein said superlattice film of at least first and second material systems and said physical interface comprise a superlattice structure with the lattice mismatch at said interface occurring in a plane of epitaxial growth of said at least two material systems and providing an acoustic mismatch to reduce thermal conduction across said physical interface; and orthogonally-quantum-confined superlattice phonon-blocking electron-transmitting structures. The deficiency of this patent is similar to those reviewed previously in relation to U.S. Pat. Nos. 5,436,467, 5,550,387 and 5,866,292.

Fabrication of TE materials with enhanced efficiencies of cooling/heating or conversion by means of chemical synthesis of bulk materials with nanoinclusions as described, for a nonlimiting example, in [K. F. Hsu, et al., *Science* 2004, 303, 818], is also included here as a reference. However, the ZT of such materials is still significantly lower than that of MBE-grown materials.

To conclude, new designs of TE materials and fabrication techniques need to be developed to realize the promise of quantum-size structure-enhancement of ZT.

SUMMARY OF THE INVENTION

It is an object of the present invention to provide a new design of thermoelectric material and device that would utilize significant ZT enhancement combined with sufficient thickness to achieve significantly enhanced cooling/heating or conversion efficiencies of TE device. It is another object of the present invention to provide the practical and cost-effective method of fabrication of such a material and device.

According to the first embodiment of the present invention the improved cooling, heating or conversion efficiency thermoelectric material consists of the three-dimensionally structured substrate having the host material with surface (or walls) and removed material, or pores, with quantum well superlattice deposited on the pore walls, said superlattice structure containing at least two layers of semiconductor materials and with electronic properties and thicknesses chosen such as the structure posses significant thermoelectric conversion efficiency and provides efficient blocking of thermal conductance combined with the good electrical conductivity in the direction normal to said substrate.

According to the second embodiment of the present invention, the method of manufacturing of high efficiency thermoelectric material is comprising providing a substrate having first and second surface with said first surface being structured to achieve high surface-to-volume ratio, and conformally coating said structured surface of a substrate with high thermoelectric efficiency quantum well superlattice.

BRIEF DESCRIPTION OF THE DRAWINGS

These and other features and advantages of presently preferred non-limiting illustrative exemplary embodiments will be better and more completely understood by referring to the following detailed description in connection with the drawings, of which:

FIG. 1 is an exemplary diagrammatic drawing of the prior art high-ZT thermoelectric material employing quantum well multilayer;

FIG. 2 is an exemplary diagrammatic drawing of the prior art high-ZT thermoelectric material employing quantum wire array made by plating porous alumina template;

FIG. 3 is an exemplary diagrammatic drawing of the prior art high-ZT thermoelectric material employing regimented quantum dot array;

FIG. 4 is an exemplary diagrammatic drawing of the high-ZT thermoelectric material of the first embodiment of the present invention comprising quantum well multilayer deposited on 3D-structured template.

DETAILED DESCRIPTION OF THE INVENTION

Figure 5A:
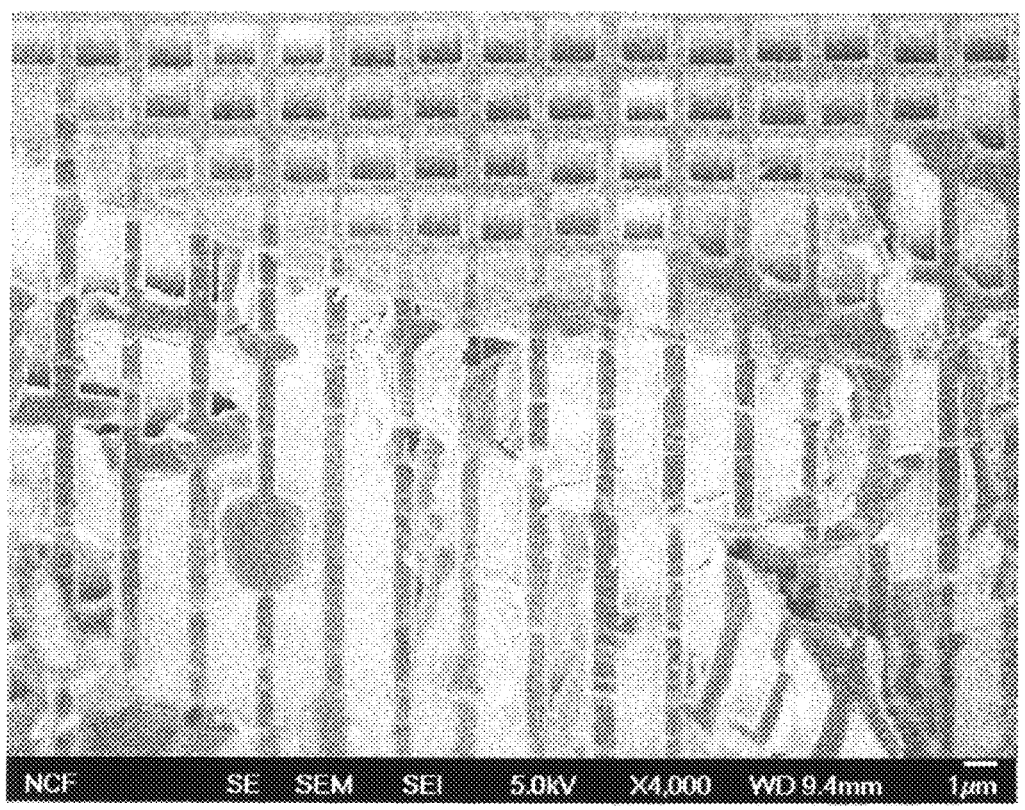
FIG. 5a is an SEM image of the top surface and cleaved side surface of macroporous silicon array coated with $Sb_2Te_3$ layer.

According to the first embodiment of the present invention the improved cooling, heating or conversion efficiency thermoelectric material has the structure illustrated in FIG. 4. The thermoelectric material consists of the three-dimensionally structured substrate 4.1 having the host material 4.1 with surface (or walls) 4.3 and removed material, or pores, 4.2, with quantum well superlattice 4.4 deposited on the pore walls, said superlattice structure containing at least two layers of semiconductor materials 4.5 and 4.6 with electronic properties and thicknesses chosen such as the structure posses significant thermoelectric conversion efficiency and provides efficient blocking of thermal conductance combined with the good electrical conductivity in the direction normal to said substrate. For a nonlimiting example, said substrate can comprise a layer of macroporous silicon electrochemically etched on silicon substrate by methods known to those skilled in the art with pore aspect ratio (length:diameter of the pore) in the range of 10 to 1000 and pore diameters in the range of 200 nm and 10 um. Alternatively, other porous semiconductor materials fabricated by means of electrochemical etching can be employed as well. Still alternatively said structured substrate can be fabricated by means of patterning and reactive ion etching of initially planar substrate. The pore walls can be additionally smoothed by adding additional anisotropic wet chemical etching step after the electrochemical, chemical or reactive ion etching. A buffer (electrically conductive or electrically isolated) layer can be also grown on the pore walls prior to the coating the walls with quantum well superlattice. The porous substrate, serving effectively as a template for quantum well superlattice growth with three-dimensional (3D) structure can be later removed by means of chemically selective etching and optionally the 3D-structured quantum well superlattice can be refilled with another material to provide mechanical reinforcement, electrical and/or thermal contact. The conformal deposition of quantum well superlattice can be performed by Chemical Vapor Deposition (CVD) technique or some of its variations (such as, for a nonlimiting example Low Pressure CVD, or Ultralow Pressure CVD), by Atomic Layer Deposition (ALD), by molecular beam epitaxy (MBE) or by any other vacuum deposition technique known to those skilled in the art. Alternatively, the conformal deposition of quantum well superlattice can be performed by wet chemical process, such as electrochemical or electroless plating. The high-efficiency quantum well superlattice can have the composition and structure such as those already known to those skilled in the art. The phonon blocking/electron transmitting regime can be realized across the quantum well layer. In such a realization the structured substrate should have high thermal conductivity and should be in good thermal contact with, for a nonlimiting example, high temperature reservoir, while the other side of the quantum well superlattice should be in a good contact with, for a nonlimiting example, a low temperature reservoir. Such a realization is beneficial for the applications where relatively small thermal gradients between the hot and cold reservoir are expected (within few 10s of degrees K). Alternatively, the phonon blocking/electron transmitting regime can be realized along the quantum well layer. In such a realization the heat and electrical conductance will happen across the substrate. Such a realization is expected to be beneficial for applications where significant difference (>10 degrees K) is expected between the hot and cold side. In both such cases deposition of few 100 nm quantum well superlattice layer on the pore walls will result in thermoelectric material with significantly enhanced ZT of up to few 100s of micrometers thick, as required by most applications of thermoelectric materials, thus providing the means to overcome the deficiencies of the prior art realizations of quantum-size effect enhanced thermoelectric materials.

Figure 5B:
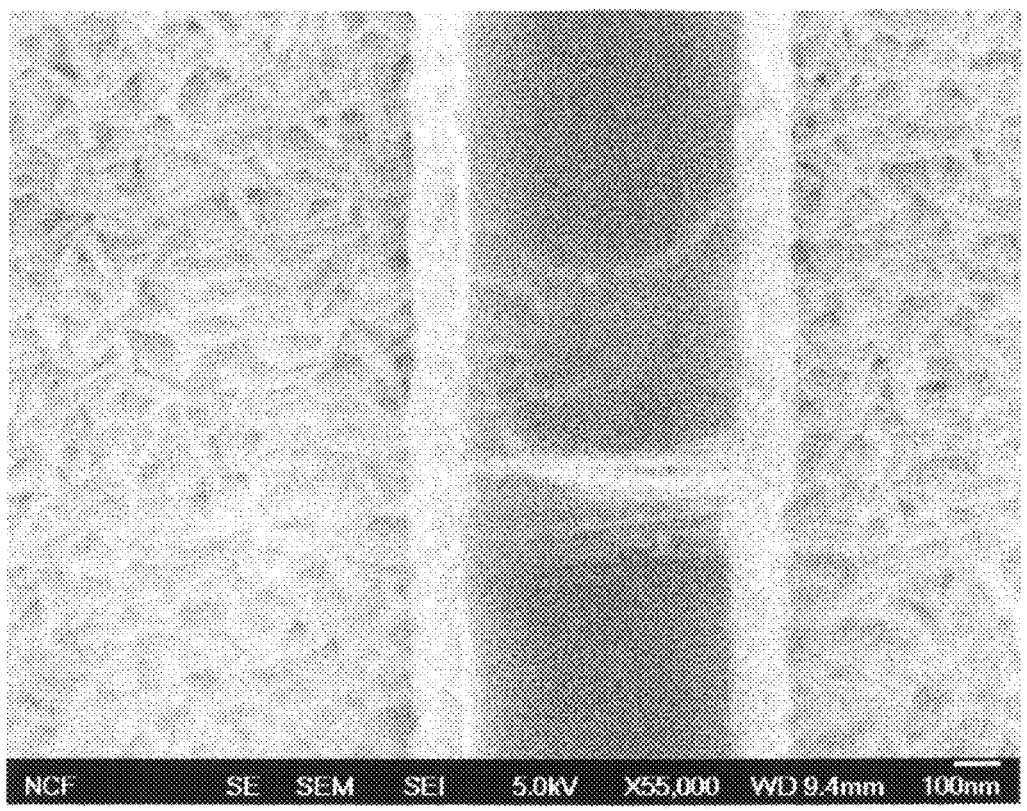
FIG. 5b is a magnified SEM image of the cleavage of the macroporous silicon array coated with $Sb_2Te_3$ layer showing clearly the conformal coating of the pores.

For a nonlimiting example, the macroporous silicon is grown on p-doped (100) oriented double side polished silicon substrate with resistivity in the range of 30 and 100 Ohm cm with preliminary fabricated array of depressions or etch pits, said etch pits being fabricated by thermal oxidation of silicon wafer, photolithography, chemical etching of oxide layer through photoresist mask with reactive ion etching and then etching said etch pits in 40% KOH aqueous solution at 60 to 100° C. temperature with oxide being removed in HF solution after etch pit definition. Said silicon wafer with defined etch pits is being coated by the contact layer from the back side (i.e., the side which does not have the etch pits) and being placed in electrochemical etching cell with electrolyte made of 5 to 10% HF, 10 to 30% ethanol and 60 to 85% diemethylsulfoxide and the current density of between 2 mA/cm$^2$ to 20 mA/cm$^2$ being applied for 30 min to 20 hours, when the macroporous silicon layer is being etched. According to this illustrative example, after the completion of electrochemical etching the backside electric contact layer is being stripped by wet chemical etching (for example, if the back contact is of gold, aqua regina can be used). Further, the pore walls can be smoothened by exposing the etched macroporous silicon layer to diluted KOH/H$_2$0/ethanol solution at temperatures between 30° C. and 60° C. The wafer with formed macroporous silicon layer can be then placed in Atomic Layer Deposition machine and Bi$_2$Te$_3$/Sb$_2$Te$_3$ superlattice with, for a nonlimiting example, 10 Å/50 Å layers of these materials will be deposited. FIGS. 5a and 5b showing exemplary SEM images of the MPSi layer coated with Sb2Te3 material by the method provided in this nonlimiting example. It should be noted that other types of quantum well superlattices can be deposited either by ALD or LP CVD technique. Ion Implantation can be used to dope the deposited layers. Follow on annealing also can be used to anneal out the defects.

Applications of TE materials of the present invention are expected in NASA missions to convert waste heat from turbine engines, hot sides of aircraft etc. into electric energy, in radioisotope thermoelectric generators (RTGs). Another expected application of the TE materials of the present invention is thermoelectric cooling (TEC). For example, electronics market requires development of miniaturized TECs with much improved efficiency.

While the invention has been described in connection with what is presently considered to be the most practical and preferred embodiment, it is to be understood that the invention is not to be limited to the disclosed embodiments. Therefore, the metes and bounds of invention are defined by the claims—not by this specification—and are intended to cover various modifications and equivalent arrangements included within the scope of those claims

What is claimed is:

1. A thermoelectric material comprising:
    a structured substrate having a plurality of elongated pores, each elongated pore being defined by walls of the pore consisting of the material of the substrate and the walls of the pores extending from at least one face of the substrate in a direction substantially normal to the face of the substrate, and
    a semiconductor quantum well superlattice of at least two layers of semiconductor material, having dissimilar characteristics from each other and being deposited directly on each other, coating a wall of each of the plurality of elongated pores of said structured substrate.

2. The thermoelectric material of claim 1, wherein one of the semiconductor materials is Bi$_2$Te$_3$ and the other semiconductor material is Sb$_2$Te$_3$.

3. The thermoelectric material of claim 1, wherein each layer of the semiconductor quantum well superlattice has a thickness in the range of 10 Å to 50 Å.

4. The thermoelectric material of claim 1, wherein the structured substrate is of the material Si.

5. The thermoelectric material of claim 1, wherein each of the plurality of pores has a pore aspect ratio in the range of 10 to 1000 and a pore diameter in the range of 0.2 µm to 10 µm.

6. A thermoelectric material comprising:
    a structured substrate having a plurality of elongated pores, each elongated pore being defined by walls of the pore consisting of the material of the substrate and the walls of the pores extending from at least one face of the substrate in a direction substantially normal to the face of the substrate,
    a buffer layer coating a wall of each of the plurality of elongated pores of said structured substrate, and
    a semiconductor quantum well superlattice of at least two layers of semiconductor material, having dissimilar characteristics from each other and being deposited directly on each other, coating the buffer layer.

7. The thermoelectric material of claim 6, wherein one of the semiconductor materials is Bi$_2$Te$_3$ and the other semiconductor material is Sb$_2$Te$_3$.

8. The thermoelectric material of claim 6, wherein each layer of the semiconductor quantum well superlattice has a thickness in the range of 10 Å to 50 Å.

9. The thermoelectric material of claim 6, wherein the structured substrate is of the material Si.

10. The thermoelectric material of claim 6, wherein each of the plurality of pores has a pore aspect ratio in the range of 10 to 1000 and a pore diameter in the range of 0.2 µm to 10 µm.

* * * * *